(12) United States Patent
Murayama et al.

(10) Patent No.: US 9,166,151 B2
(45) Date of Patent: Oct. 20, 2015

(54) MAGNETORESISTIVE ELEMENT AND MANUFACTURING METHOD OF THE SAME

(71) Applicant: Kabushiki Kaisha Toshiba, Tokyo (JP)

(72) Inventors: Akiyuki Murayama, Fukuoka (JP); Masahiko Nakayama, Yamaguchi (JP); Satoshi Seto, Kanagawa (JP); Tatsuya Kishi, Kanagawa (JP); Masaru Toko, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/777,835

(22) Filed: Feb. 26, 2013

(65) Prior Publication Data

US 2013/0313506 A1  Nov. 28, 2013

(30) Foreign Application Priority Data

May 24, 2012  (JP) .................................. 2012-118842

(51) Int. Cl.
*H01L 43/12* (2006.01)
*H01L 43/02* (2006.01)

(52) U.S. Cl.
CPC ................ *H01L 43/12* (2013.01); *H01L 43/02* (2013.01)

(58) Field of Classification Search
CPC ......... H01L 43/08; H01L 43/12; H01L 27/20; H01L 43/02; G11C 11/16; G11C 11/161

USPC ....... 257/E27.006, E43.006, E21.665; 438/3; 365/158

See application file for complete search history.

(56) References Cited

U.S. PATENT DOCUMENTS

| | | | |
|---|---|---|---|
| 2005/0048675 A1 | 3/2005 | Ikeda | |
| 2010/0184239 A1 | 7/2010 | Matsuzaki | |
| 2011/0059557 A1* | 3/2011 | Yamagishi et al. | 438/3 |
| 2012/0061781 A1* | 3/2012 | Ohmori et al. | 257/421 |
| 2012/0187510 A1* | 7/2012 | Jung et al. | 257/421 |

FOREIGN PATENT DOCUMENTS

| | | | |
|---|---|---|---|
| JP | 2003-078184 | * | 3/2003 |
| JP | 2008-218829 A | | 9/2008 |
| JP | 2011-249590 | | 12/2011 |
| JP | 2011-249590 A | | 12/2011 |

* cited by examiner

*Primary Examiner* — Jessica Stultz
*Assistant Examiner* — Mohammed R Alam
(74) *Attorney, Agent, or Firm* — Patterson & Sheridan, LLP

(57) ABSTRACT

A magnetoresistive element has a magnetic layer, an insulating layer and a magnetic layer, which are laminated on a base electrode, and side walls of the magnetic layers that are formed when the magnetic layers are processed. At least one element selected from the group of consisting He, C, N, O, F, Ne, Ti, V, Cu, Al, Si, P, S, Cl, Ar, Ge, As, Kr, Zr, In, Sn, Sb, Pb and Bi is injected into the side walls and edge portions of the magnetic layers to improve the magnetic characteristics of the first and second magnetic layers.

8 Claims, 10 Drawing Sheets

FILM THICKNESS OF MAGNETIC LAYERS (nm)

FILM THICKNESS OF MAGNETISM EXISTING LAYER (nm)

FILM THICKNESS OF MAGNETISM EXISTING LAYER (nm)

MAGNETORESISTIVE ELEMENT AND MANUFACTURING METHOD OF THE SAME

CROSS-REFERENCE TO RELATED APPLICATION

This application is based upon and claims the benefit of priority from Japanese Patent Application No. 2012-118842, filed May 24, 2012; the entire contents of which are incorporated herein by reference.

FIELD

Embodiments described herein relate generally to a magnetoresistive element and its manufacturing method.

BACKGROUND

MTJ (Magnetic Tunnel Junction) elements exploit the magnetoresistive effect (i.e., variable resistance according to the magnetization direction) and are incorporated in Magnetic Random Access Memory (MRAM). An MTJ element has a 3-layer structure including a reference layer, a memory layer, and an insulating layer that forms a tunnel barrier and sandwiched between the reference layer and the memory layer. The magnetization of the reference layer is fixed in one direction, and no inversion takes place in the reference layer even when the write operation is carried out. On the other hand, the magnetization of the memory layer can be inverted during the write operation.

When the MTJ element is processed into a pillar shape, the substrate electrode of the MTJ element is partially etched because the process employs over-etching, and the partially etched electroconductive substance is re-attached on the side wall of the MTJ element. The re-attached substance causes a short circuit of the memory layer and the reference layer. When the memory layer and the reference layer are short circuited, it is impossible to write the data in the MTJ element.

DETAILED DESCRIPTION

Embodiments provide a magnetoresistive element that can prevent short circuit between magnetic layers and, at the same time, can prevent degradation in the magnetic characteristics of the magnetic layers.

In general, according to one embodiment, embodiments of the present disclosure will be explained with reference to the drawings. Here, the drawings are just schematic or conceptual diagrams. They are not necessarily in scale to the actual objects. In the description of the embodiments to be presented later, the devices and methods that embody the technical ideas of the present disclosure will be presented. The technical ideas of the present disclosure are not limited by the shapes, structures, configurations, etc. of the structural parts. In the following, the same keys are used throughout, and so they will not be explained repeatedly.

One embodiment provides a magnetoresistive element that has a first magnetic layer, an insulating layer and a second magnetic layer, which are laminated on a base electrode, and at least one element selected from the group consisting of He, C, N, O, F, Ne, Ti, V, Cu, Al, Si, P, S, Cl, Ar, Ga, Ge, As, Kr, Zr, In, Sn, Sb, Pb and Bi is injected into edge portions of the first and second magnetic layers.

The manufacturing method of the magnetoresistive element according to an embodiment has the following processes: a process in which the magnetoresistive element having a first magnetic layer, an insulating layer and a second magnetic layer, which are laminated on a base electrode, is processed to a pillar shape, a process in which an element for deactivating magnetization is injected into edge portions of the first and second magnetic layers, and a process in which a short circuit path between the first and second magnetic layers caused by side walls of the magnetoresistive element is removed.

First Embodiment

Figure 1A:
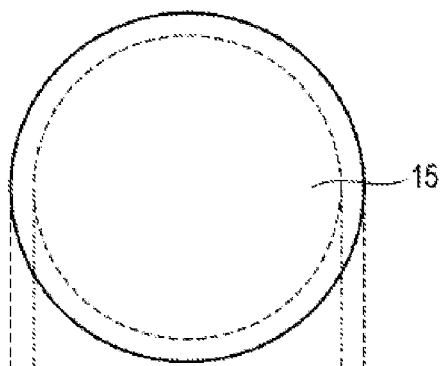
FIGS. 1A and 1B include a plane view and a cross-sectional view of an MTJ element according to a first embodiment.
Figure 1B:
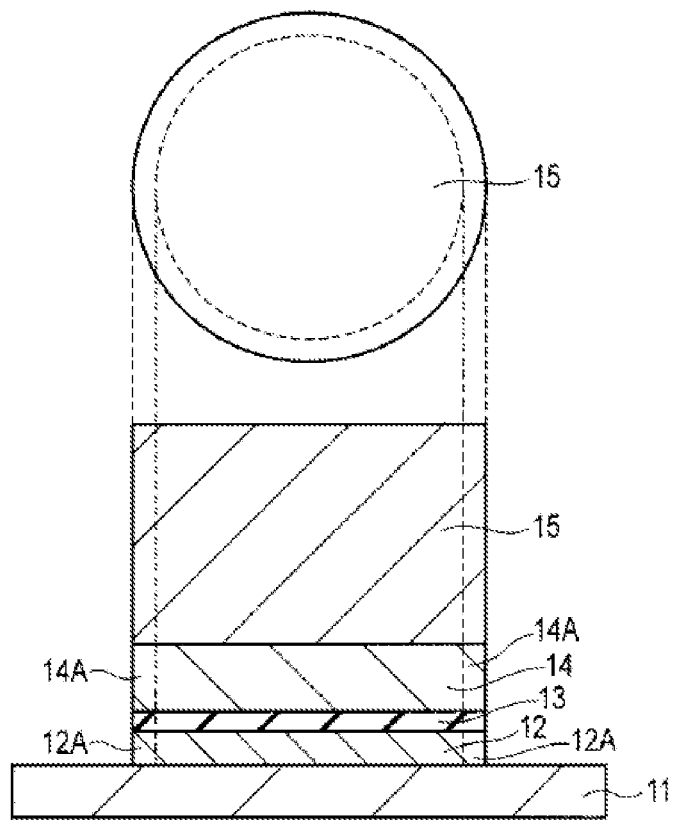

First of all, the constitution of the MTJ element (magnetoresistive element) will be explained. FIG. 1A is a plane view illustrating the MTJ element according to a first embodiment. FIG. 1B is a cross-sectional view illustrating the MTJ element.

The MTJ element has the following layers arranged sequentially from the bottom side and laminated: a base electrode (lower electrode) 11, a memory layer 12, an insulating layer (tunnel barrier layer) 13, a reference layer 14, and a hard mask layer 15. The order of laminating for the memory layer 12 and the reference layer 14 may be reversed. The planar shape of the MTJ element may be a round shape.

The memory layer 12 and the reference layer 14 each are made of a ferromagnetic material, have magnetic anisotropic property in a direction perpendicular to the film surface, and have their magnetization-prone direction perpendicular to the film surface. That is, the MTJ element is a perpendicular magnetization-type MTJ element having the magnetization directions of the memory layer 12 and the reference layer 14 perpendicular with respect to the film surface. In addition, the MTJ element may also an in-plane magnetization-type MTJ element where the magnetization directions of the memory layer 12 and the reference layer 14 are in their in-plane directions, respectively.

The memory layer 12 has its magnetization direction changeable (invertable). The reference layer 14 has its magnetization direction unchangeable (fixed). The reference layer 14 is designed to have a magnetic anisotropic energy significantly larger than that of the memory layer 12. Also, the reference layer 14 is designed to have a damping constant larger than that of the memory layer 12. The magnetic anisotropy and the damping constant can be set by adjusting the material constitution and the film thickness. As a result, the magnetization inversion current of the memory layer 12 is low, and the magnetization inversion current of the reference layer 14 is larger than that of the memory layer 12. As a result, it is possible to realize the MTJ element having the memory layer 12 with its magnetization direction changeable and the reference layer 14 with its magnetization direction unchangeable with respect to the prescribed write current.

The memory layer 12 and the reference layer 14 each are made of an alloy containing one or more elements selected from the group consisting of, for example, cobalt (Co), iron (Fe), and nickel (Ni). Alternatively, the memory layer 12 and the reference layer 14 each may be formed by alternately laminating an alloy containing at least one element selected from the group consisting of cobalt (Co), iron (Fe), and nickel (Ni) and an alloy containing at least one element selected from the group consisting of nickel (Ni), platinum (Pt), palladium (Pd), and chromium (Cr).

As the substrate electrode 11, tantalum (Ta), titanium nitride (TiN), hafnium (Hf), tungsten (W), or the like may be used. As the insulating layer 13, for example, magnesium oxide (MgO) may be used. As the hard mask layer 15, titanium (Ti), titanium nitride (TiN), tantalum nitride (TaN), etc. may be used.

In this embodiment, the element for deactivating the magnetization is injected into an end portion 12A on the entire circumference of the memory layer 12. Similarly, the element for deactivating the magnetization is injected into the end portion 14A on the entire circumference of the reference layer 14. That is, the end portion 12A of the memory layer 12 and the end portion 14A of the reference layer 14 have the magnetization deactivated. According to the present embodiment, "deactivation" includes the case when the magnetization of the magnetic layer is almost entirely eliminated and the case when the magnetization of the magnetic layer is partially decreased.

As to be explained later, when the MTJ element is processed, re-attached substance is formed on the side wall of the MTJ element. Consequently, there are the process of removal of the re-attached substance and/or the process of oxidation of the re-attached substance. In this case, the side wall of the MTJ element is damaged, degrading the magnetic characteristics of the memory layer 12 and the reference layer 14. As a result, the damping constants of the memory layer 12 and the reference layer 14 increase (called damping damage), and the spin injection efficiency of the MTJ element degrades. Consequently, according to the present embodiment, the element for deactivating the magnetization is injected into the end portion 12A of the memory layer 12 to deactivate the magnetization of the end portion 12A of the memory layer 12. Similarly, the element for deactivating the magnetization is injected into the end portion 14A of the reference layer 14 to deactivate the magnetization of the end portion 14A of the reference layer 14. As a result, it is possible to alleviate the damping damage of the end portion 12A of the memory layer 12 and the end portion 14A of the reference layer 14. Consequently, it is possible to alleviate degradation in the magnetic characteristics of the memory layer 12 and the reference layer 14.

The element employed for deactivating the magnetization of the magnetic layers includes at least one element selected from the group consisting of He (helium), C (carbon), N (nitrogen), O (oxygen), F (fluorine), Ne (neon), Ti (titanium), V (vanadium), Cu (copper), Al (aluminum), Si (silicon), P (phosphorus), S (sulfur), Cl (chlorine), Ar (argon), Ga (gallium), Ge (germanium), As (arsenic), Kr (krypton), Zr (zirconium), In (indium), Sn (tin), Sb (antimony), Pb (lead), and Bi (bismuth).

According to the present embodiment, a spin injection write system is used. According to this system, a write current directly flows into the MTJ element, and this write current is used to control a magnetization state of the MTJ element. For the MTJ element, depending on whether the magnetizations of the memory layer 12 and the reference layer 14 are parallel or anti-parallel to each other, it can take either a low-resistance state or a high-resistance state.

For the MTJ element, as the write current flows from the memory layer 12 to the reference layer 14, the relative relationship between the memory layer 12 and the reference layer 14 become parallel with each other. In the case of the parallel state, the resistance of the MTJ element becomes lowest, and the MTJ element is set in the low-resistance state. For example, the low-resistance state of the MTJ element is defined to represent the data "0".

On the other hand, for the MTJ element, when the write current flows from the reference layer 14 to the memory layer 12, the relative relationship between the memory layer 12 and the reference layer 14 becomes anti-parallel to each other. In the case of this anti-parallel state, the resistance of the MTJ element becomes the highest, and the MTJ element is set in the high-resistance state. For example, the high-resistance state of the MTJ element is defined to represent the data "1".

As a result, it is possible to use the MTJ element as a memory element that can store 1-bit data. The allotment of the resistance state and the data for the MTJ element can be set at will. When data are read from the MTJ element, for example, a read voltage is applied on the MTJ element, and the resistance value of the MTJ element is detected on the basis of the read current flowing into the MTJ element in this case. This read current is set at a value significantly smaller than the threshold for the magnetization inversion by the spin injection.

(Manufacturing Method)

In the following, the manufacturing method of the MTJ element will be explained with reference to the drawings.

Figure 2:
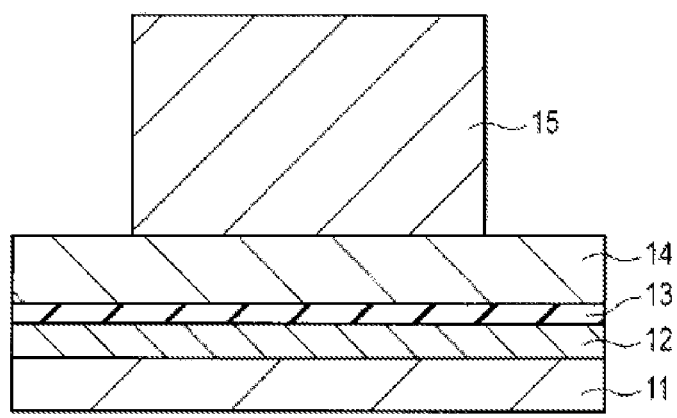
FIG. 2 is a cross-sectional view illustrating a manufacturing operation of the MTJ element according to the first embodiment.

First of all, referring to FIG. 2, the base electrode 11, the memory layer 12, the insulating layer (tunnel barrier layer) 13, the reference layer 14, and the hard mask layer 15 are sequentially deposited on contacts and an interlayer insulating film (not shown in the drawing) electrically connected to a selection transistor and other elements. Then, by the lithography and, for example, RIE (Reactive Ion Etching) method, the hard mask layer 15 is processed to the same planar shape as the final planar shape of the MTJ element.

Figure 3A:
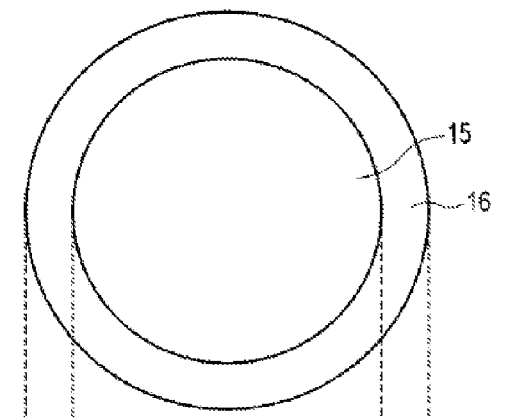
FIGS. 3A and 3B include a plane view and a cross-sectional view illustrating the manufacturing operation of the MTJ element after the process shown in FIG. 2.
Figure 3B:
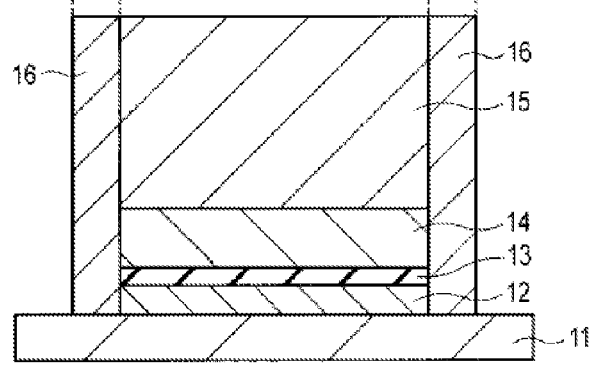

Then, for example, by using the IBE (Ion Beam Etching) method, with the hard mask layer 15 as a mask, the memory layer 12, the insulating layer 13 and the reference layer 14 are processed to the pillar shape. FIGS. 3A and 3B include diagrams illustrating the processing operation for the side wall of the MTJ element. Here, FIG. 3A is a plane view, and FIG. 3B is a cross-sectional view. In the processing of the side wall of the MTJ element, in order to correctly process until the memory layer 12, the IBE operation is carried out until the substrate electrode 11 is carved, resulting in over-etching. At that time, the etched substances flux from the memory layer 12 and substrate electrode 11 are partially directed to the side wall of the MTJ element. These etched substances are not deactivated because IBE employs physical etching. As a result, these etched substances are physically re-attached, forming a re-attached substance 16 on the side wall of the MTJ element. For example, the re-attached substance 16 may be formed on the entire circumference of the MTJ element. The re-attached substance 16 contains the materials from the substrate electrode 11 and the memory layer 12. In this stage, the memory layer 12 and the reference layer 14 are short circuited by the re-attached substance 16.

Figure 4:
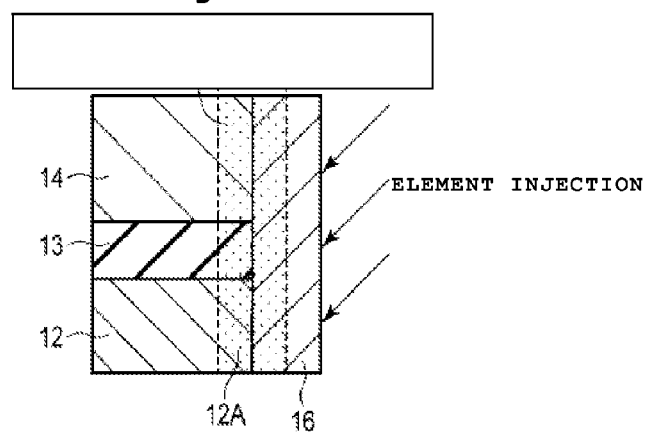
FIG. 4 includes a plane view and a cross-sectional view illustrating the manufacturing operation of the MTJ element after the process shown in FIGS. 3A and 3B.

Then, an element for deactivating the magnetization of the magnetic layers (Ge (germanium), Si (silicon), etc.) is injected into the end portion on the entire circumference of the MTJ element. FIG. 4 is a cross-sectional view illustrating this element injection operation. This cross-sectional view illustrates the end portion of the MTJ element and a portion of the re-attached substance 16. The state of the end portion on the entire circumference of the MTJ element is the same as that shown in FIG. 4. With the element injection operation, the element for deactivating the magnetization is injected into the end portion on the entire circumference of the MTJ element and a portion of the re-attached substance 16 in contact with the end portion. The hatched region in FIG. 4 shows an element injecting region 17 where the element for deactivating the magnetization is injected. An injecting angle in the element injecting operation may be in the range of 0 to 45° with respect to the direction perpendicular to the film surface.

The element injected into the end portion of the MTJ element works as the deactivating seeds for deactivating the magnetization of the end portion of the magnetic layers. That is, magnetization is deactivated for the end portion 12A of the memory layer 12 where the element is injected. Similarly, magnetization is deactivated for the end portion 14A of the reference layer 14 where the element is injected.

Figure 5:
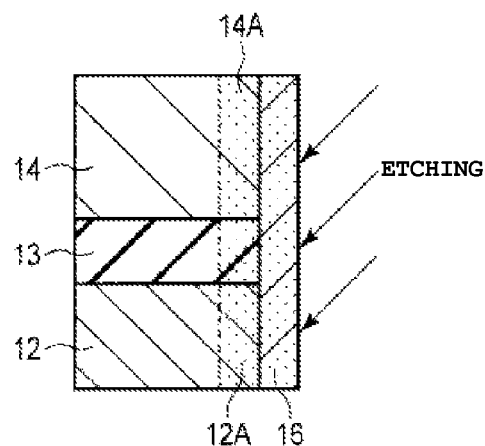
FIG. 5 includes a plane view and a cross-sectional view illustrating the manufacturing operation of the MTJ element after the process shown in FIG. 4.

Then, as shown in FIG. 5, for example, the IBE method is used to remove the re-attached substance 16 formed on the side wall of the MTJ element. As a result, as the short circuit path between the memory layer 12 and the reference layer 14 is removed, it is possible to prevent short circuit between the memory layer 12 and the reference layer 14. However, the re-attached substance 16 may not be fully removed as a result of the IBE method, and a portion of the re-attached substance 16 may be left on the side wall of the MTJ element. Here, it would be difficult for the re-attached substance 16 to be re-attached uniformly on the side wall of the MTJ element, so it is likely that the re-attached substance 16 with partially different thickness is not entirely removed.

Figure 6:
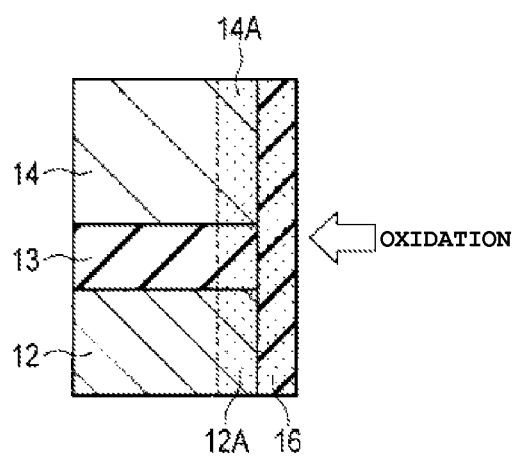
FIG. 6 includes a plane view and a cross-sectional view illustrating the manufacturing operation of the MTJ element after the process shown in FIG. 5.

Then, as shown in FIG. 6, the partially left re-attached substance 16 is oxidized. As a result, the re-attached substance 16 becomes the insulating oxide (re-attached oxide), and it is possible to reliably prevent short circuit between the memory layer 12 and the reference layer 14.

Here, any one or both of the process of removal of the re-attached substance and the process of oxidation of the re-attached substance are carried out, so that the side wall of the MTJ element is damaged, and the magnetic characteristics of the memory layer 12 and the reference layer 14 are degraded. As a result, the damping constants (and therefore, damping damages) increase for the memory layer 12 and the reference layer 14, and the spin injection efficiency of the MTJ element degrades. However, according to the present embodiment, in the memory layer 12, the end portion 12A where the element is injected (deactivated portion) has the magnetization deactivated, so that it is possible to alleviate the damping damages of the memory layer 12. Similarly, in the reference layer 14, the end portion 14A (deactivated portion) where the element is injected has the magnetization deactivated, so that the damping damages of the reference layer 14 can be alleviated. Even when damages take place on the side wall of the MTJ element caused by operations other than the process of removal of the re-attached substance and the process of oxidation of the re-attached substance, it is also possible to alleviate the damping damages of the memory layer 12 and the reference layer 14.

In addition, in the process of oxidation of the re-attached substance, the element injected into the magnetic layers (the memory layer 12 and the reference layer 14) is also oxidized. The oxide ($GeO_2$, $SiO_2$, or the like) also works as the deactivating seeds, and the effect of deactivation of the magnetization of the end portion of the magnetic layers is maintained, so that it is possible to alleviate the damping damages of the magnetic layers. Also, as the injected element is oxidized, the oxidation of the magnetic layers can be decreased relatively, so that it is possible to alleviate the damping damages of the magnetic layers caused by oxidation.

In the following, the reason for alleviating the damping damages of the magnetic layers will be explained with reference to the experimental results. In the following explanation of the experimental results, the magnetic layer is deposited on the substrate electrode, and the element for deactivating the magnetization is injected in the direction perpendicular to the film surface of the magnetic layer, or at the angle with respect to the direction perpendicular to the film surface in the range of $0<\theta<90$. Consequently, the film thickness of the magnetic layer below refers to the dimension in the lateral direction in FIG. 4.

Figure 7:
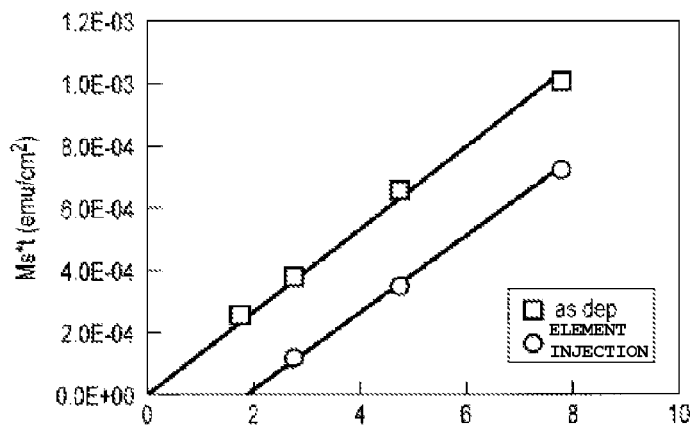
FIG. 7 is a graph illustrating magnetization of magnetic layers before and after injection of the element for deactivating the magnetization.

FIG. 7 is a graph illustrating the magnetization of the magnetic layer before and after injection of the element for deactivating the magnetization. In FIG. 7, the abscissa represents the film thickness of the magnetic layer (nm), and the ordinate represents the product of Ms*t(A/m²), where Ms represents the saturated magnetization and t represents the film thickness, and * represents the multiplication symbol. FIG. 7 includes a graph (as dep) illustrating the state before injection of the element for deactivating the magnetization into the magnetic layer, and a graph illustrating the state after injection of the element for deactivating the magnetization into the magnetic layer.

As can be seen from FIG. 7, when the element for deactivating the magnetization is injected into the magnetic layer, compared with the magnetic layer before the element injection, the magnetization of the portion with a film thickness of about 2 nm is deactivated. From this experimental result, it can be seen that as Ge (germanium) or Si (silicon) or other element is injected into the magnetic layer, the magnetization of the portion where the element is injected can be deactivated.

Figure 8:
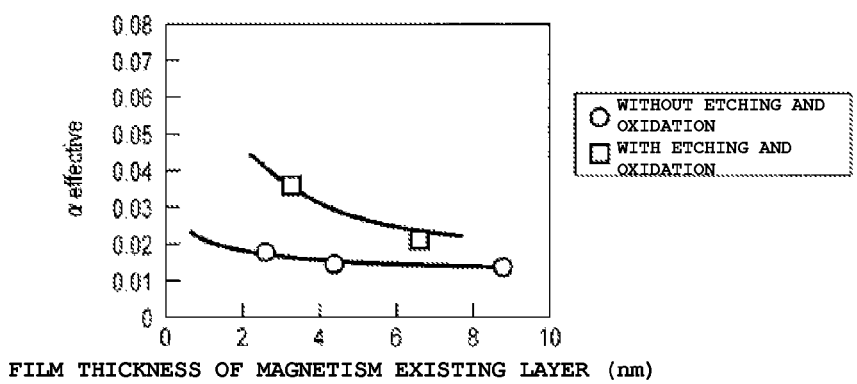
FIG. 8 is a graph illustrating an effective damping constant of the magnetic layers in the case of etching and oxidation of a re-attached substance.

FIG. 8 is a graph illustrating the effective damping constant of the magnetic layer when the re-attached substance is etched and oxidized. In FIG. 8, the abscissa represents the film thickness (nm) of the magnetism existing layer, and the ordinate represents the effective damping constant (α effective). The magnetism existing layer refers to the portion of the magnetic layer where the magnetization deactivation does not take place. Also, the effective damping constant refers to the damping constant actually measured for the magnetic layer that has the magnetization partially deactivated. FIG. 8 includes the graph when the process of removal of the re-attached substance (etching process) and the process of oxidation of the re-attached substance are not carried out while the re-attached substance is formed on the magnetic layer, and the graph when the process of removal of the re-attached substance and the process of oxidation of the re-attached substance are carried out. As can be seen from FIG. 8, when the process of removal of the re-attached substance and the process of oxidation of the re-attached substance are carried out, the effective damping constant of the magnetic layer is increased.

Figure 9:
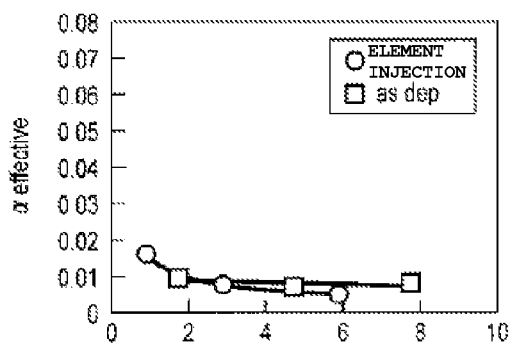
FIG. 9 is a graph illustrating the effective damping constant of the magnetic layers before and after injection of the element for deactivating the magnetization.

FIG. 9 is a graph illustrating the effective damping constant of the magnetic layer before and after injection of the element for deactivating the magnetization. In FIG. 9, the abscissa represents the film thickness (nm) of the magnetism existing layer, and the ordinate represents the effective damping constant (α effective). FIG. 8 includes the graph (as dep) before injection of the element for deactivating the magnetization into the magnetic layer, and the graph after injection of the element for deactivating the magnetization into the magnetic layer. As can be seen from FIG. 9, even when the element for deactivating the magnetization is injected into the magnetic layer, there is still little increase in the effective damping constant of the magnetic layer compared with that before injection of the element.

The experimental results shown in FIG. 7 to FIG. 9 can be summarized as follows: as the re-attached substance 16 formed on the side walls of the magnetic layers (the memory layer 12 and the reference layer 14) is removed and oxidized, the magnetic characteristics of the end portion of the magnetic layers degrade, and the damping constant increases. However, when Ge (germanium), Si (silicon) or other element is injected into the magnetic layers to deactivate the magnetization of the end portions of the magnetic layers, it is possible to decrease the damping damages of the magnetic layers.

(Effects)

In the first embodiment explained in detail above, after the MTJ element having the memory layer 12, the insulating layer 13 and the reference layer 14 laminated on the substrate electrode 11 is processed to the pillar shape, the element for deactivating the magnetization is injected into the side walls (the end portions in the in-plane direction) of the memory layer 12 and the reference layer 14 to deactivate the magnetization of the end portion 12A of the memory layer 12 and the end portion 14A of the reference layer 14. Then, the re-attached substance 16 formed on the side wall of the magnetoresistive element is removed (etched) and oxidized.

Consequently, according to the first embodiment, it is possible to remove and oxidize the re-attached substance 16 as the cause of short circuit between the magnetic layers, so that it is possible to prevent the short circuit between the magnetic layers. Also, in the process of removal of the re-attached substance 16 and the process of oxidation of the re-attached substance 16, the magnetic characteristics degrade and the damping constant increases for the end portions of the magnetic layers. However, as the magnetization of the end portions of the magnetic layers is deactivated beforehand, it is possible to prevent degradation in the magnetic characteristics of the magnetic layers, and it is possible to prevent increases in the damping constant of the magnetic layers. As a result, it is possible to suppress degradation in the spin injection efficiency of the MTJ element.

In addition, the element injected into the magnetic layers in the process of oxidation of the re-attached substance 16 is also oxidized, the oxide of the element works as the deactivating seeds, and the effect in deactivating the magnetization of the end portions of the magnetic layers can be maintained. In addition, as oxidation of the magnetic layers is decreased relatively by oxidation of the injected element, it is possible to prevent increase in the damping constant of the magnetic layers caused by the oxidation operation.

Second Embodiment

According to the second embodiment, after execution of the process of removal of the re-attached substance and the process of oxidation of the re-attached substance to remove the short circuit path between the memory layer 12 and the reference layer 14, the magnetization is deactivated for the end portion of the memory layer 12 and the end portion of the reference layer 14, so that the damping damages are alleviated.

In the following, the manufacturing method of the MTJ element according to the second embodiment will be explained with reference to the drawings. The manufacturing processes of manufacturing until that shown in FIGS. 3A and 3B are the same as those in the first embodiment.

Figure 10:
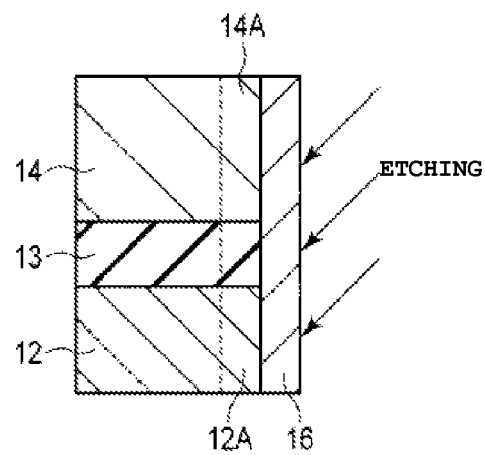
FIG. 10 is a cross-sectional view illustrating a manufacturing operation of an MTJ element according to a second embodiment.

Then, as shown in FIG. 10, for example, the IBE method is used to remove the re-attached substance 16 formed on the side wall of the MTJ element. As a result, the short circuit path between the memory layer 12 and the reference layer 14 is removed, so that it is possible to prevent short circuit between the memory layer 12 and the reference layer 14. Also, as shown in FIG. 10, the re-attached substance 16 is not entirely removed, and a portion of the re-attached substance 16 is left on the side wall of the MTJ element. By the operation of removal of the re-attached substance, for the end portion 12A on the entire circumference of the memory layer 12, the magnetic characteristics degrade, and the damping damages become significant. Similarly, by the operation of removal of the re-attached substance, in the end portion 14A on the entire circumference of the reference layer 14, the magnetic characteristics degrade, and the damping damages become significant.

Figure 11:
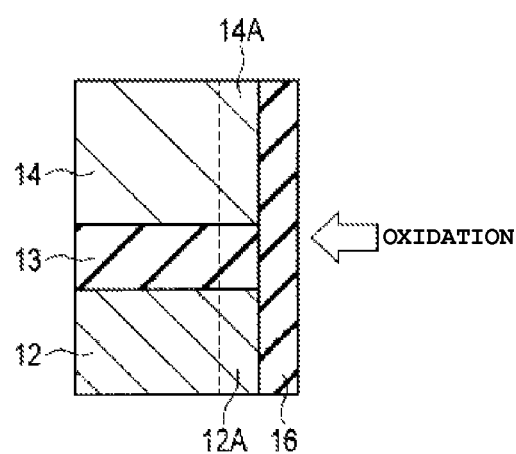
FIG. 11 is a cross-sectional view illustrating the manufacturing operation of the MTJ element after the process shown in FIG. 10.

Then, as shown in FIG. 11, the partially left re-attached substance 16 is oxidized. As a result, the re-attached substance 16 becomes an insulating oxide (re-attached oxide), it is possible to reliably prevent short circuit between the memory layer 12 and the reference layer 14. By the operation of oxidation of the re-attached substance, the damping damages become more significant for the end portion 12A of the memory layer 12 and the end portion 14A of the reference layer 14.

Figure 12:
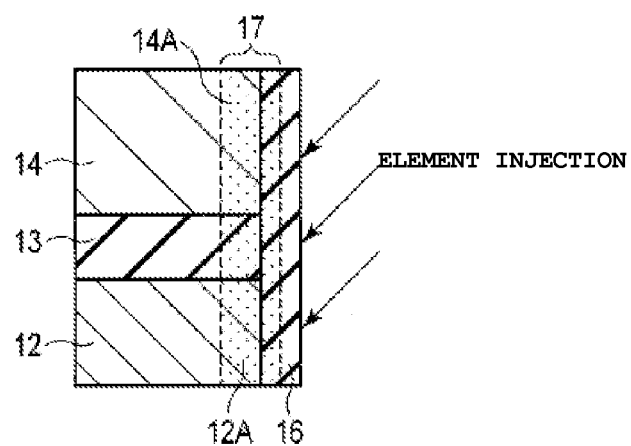
FIG. 12 is a cross-sectional view illustrating the manufacturing operation of the MTJ element after the process shown in FIG. 11.

Then, as shown in FIG. 12, an element (Ge (germanium) or Si (silicon) or the like) for deactivating the magnetization of the magnetic layers is injected into the end portion of the entire circumference of the MTJ element. By the process of injection of the element, the element for deactivating the magnetization is injected into the end portion 12A on the entire circumference of the memory layer 12, the end portion 14A on the entire circumference of the reference layer 14 and a portion of the re-attached substance 16. In FIG. 12, the hatched portion indicates the element injecting region 17 where the element for deactivating the magnetization is injected.

The magnetization is deactivated for the end portion 12A of the memory layer 12 where the element is injected. Similarly, the magnetization is deactivated for the end portion 14A of the reference layer 14 where the element is injected. By the process of removal of the re-attached substance and the process of oxidation of the re-attached substance, the damping damages of the end portion of the memory layer 12 and end portion of the reference layer 14 become more significant. However, as the magnetization is deactivated for the end portion of the memory layer 12 and the end portion of the reference layer 14, it is possible to alleviate the damping damages of the end portion of the memory layer 12 and the end portion of the reference layer 14.

In this way, the same effects as those in the first embodiment can be realized also in the case when the process of removal of the re-attached substance 16 and the process of oxidation of the re-attached substance 16 are carried out, and then the magnetization of the end portion of the memory layer 12 and the end portion of the reference layer 14 is deactivated.

Third Embodiment

According to a third embodiment, after the magnetization of the end portion of the memory layer 12 and the end portion of the reference layer 14 is deactivated, only the process of removal of the re-attached substance formed on the side wall of the MTJ element is carried out.

In the following, the manufacturing method of the MTJ element according to the third embodiment will be explained with reference to the drawings. Here, the processes of manufacturing until that shown in FIGS. 3A and 3B are the same as those in the first embodiment.

Figure 13:
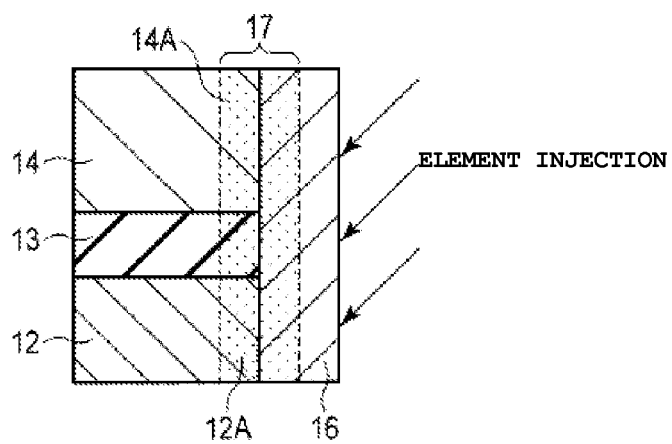
FIG. 13 is a cross-sectional view illustrating a manufacturing operation of an MTJ element according to a third embodiment.

Then, as shown in FIG. 13, the element for deactivating the magnetization (Ge (germanium) or Si (silicon) or the like) is injected into the end portion of the entire circumference of the MTJ element. By the process of element injection, the element for deactivating the magnetization of the magnetic layers is injected into the end portion 12A of the entire circumference of the memory layer 12, the end portion 14A of the entire circumference of the reference layer 14, and a portion of the re-attached substance 16. In FIG. 13, the hatched portion indicates the element injecting region 17 as the region where the element for deactivating the magnetization is injected. The magnetization is deactivated for the end portion 12A of the memory layer 12 where the element is injected, and, similarly, the magnetization is deactivated for the end portion 14A of the reference layer 14 where the element is injected.

Figure 14:
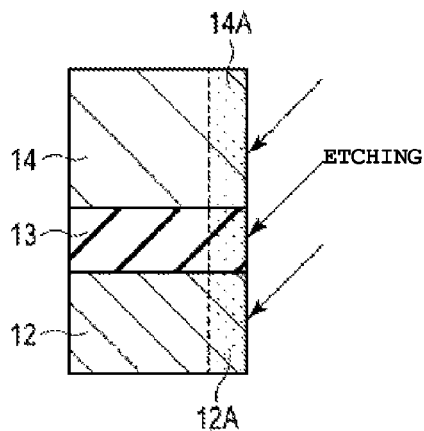
FIG. 14 is a cross-sectional view illustrating the manufacturing operation of the MTJ element after the process shown in FIG. 13.

Then, as shown in FIG. 14, for example, the IBE method is used to remove the re-attached substance 16 formed on the side wall of the MTJ element. As a result, it is possible to eliminate the short circuit path between the memory layer 12 and the reference layer 14, so that it is possible to prevent the short circuit between the memory layer 12 and the reference layer 14.

With the process of removal of the re-attached substance 16, magnetic damages take place for the side wall of the MTJ element. However, the magnetization is deactivated at the end portion of the memory layer 12 and the end portion of the reference layer 14. As a result, it is possible to alleviate the damping damages of the end portion of the memory layer 12 and the end portion of the reference layer 14. Consequently, it is possible to alleviate the degradation in the magnetic characteristics of the memory layer 12 and the reference layer 14.

Fourth Embodiment

According to a fourth embodiment, after the process of removal of the re-attached substance formed on the side wall of the MTJ element, the magnetization is deactivated for the end portion of the memory layer 12 and the end portion of the reference layer 14.

In the following, the manufacturing method of the MTJ element according to the fourth embodiment will be explained with reference to the drawings. The processes of manufacturing until that shown in FIGS. 3A and 3B are the same as those in the first embodiment.

Figure 15:
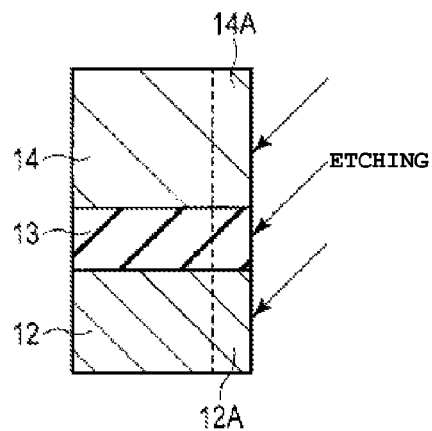
FIG. 15 is a cross-sectional view illustrating a manufacturing operation of an MTJ element according to a fourth embodiment.

Then, as shown in FIG. 15, for example, the IBE method is used to remove the re-attached substance 16 formed on the side wall of the MTJ element. As a result, it is possible to remove the short circuit path between the memory layer 12 and the reference layer 14, so that it is possible to prevent the short circuit between the memory layer 12 and the reference layer 14. By the process of removal of the re-attached substance, damages take place on the side wall of the MTJ element, and the magnetic characteristics of the memory layer 12 and the reference layer 14 degrade. As a result, the damping damages of the memory layer 12 and the reference layer 14 become significant, and the spin injection efficiency of the MTJ element degrades. In FIG. 15, the end portion 12A of the memory layer 12 and the end portion 14A of the reference layer 14 indicate the regions where damping damages take place.

Figure 16:
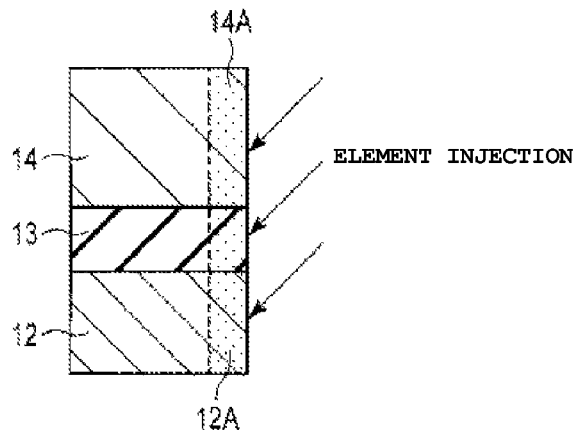
FIG. 16 is a cross-sectional view illustrating the manufacturing operation of the MTJ element after the process shown in FIG. 15.

Then, as shown in FIG. 16, an element for deactivating the magnetization (Ge (germanium) or Si (silicon) or the like) is injected into the end portion of the entire circumference of the MTJ element. By this process of element injection, the element for deactivating the magnetization is injected into the end portion 12A of the entire circumference of the memory layer 12, the end portion 14A of the entire circumference of the reference layer 14, and a portion of the re-attached substance 16. In FIG. 16, the hatched portion indicates the element injecting region 17 as the region where the element for deactivating the magnetization is injected. The magnetization is deactivated for the end portion 12A of the memory layer 12 where the element is injected. In the same way, the magnetization is deactivated for the end portion 14A of the reference layer 14 where the element is injected.

According to the fourth embodiment, even when magnetic damages take place at the end portion of the memory layer 12 and the end portion of the reference layer by the operation of removal of the re-attached substance 16, the magnetization of the end portion of the memory layer 12 and the end portion of the reference layer 14 can be deactivated, so that it is possible to alleviate degradation in the magnetic characteristics of the memory layer 12 and the reference layer 14.

In this way, the same effects as those in the third embodiment can be realized when the operation of removal of the re-attached substance 16 is first carried out, and then the magnetization is deactivated for the end portion of the memory layer 12 and the end portion of the reference layer 14.

Fifth Embodiment

According to a fifth embodiment, after the magnetization is deactivated for the end portion of the memory layer 12 and the end portion of the reference layer 14, only the process of oxidation of the re-attached substance formed on the side wall of the MTJ element is carried out.

In the following, the manufacturing method of the MTJ element according to the fifth embodiment will be explained with reference to the drawings. The processes of manufacturing until that shown in FIGS. 3A and 3B are the same as those in the first embodiment.

Figure 17:
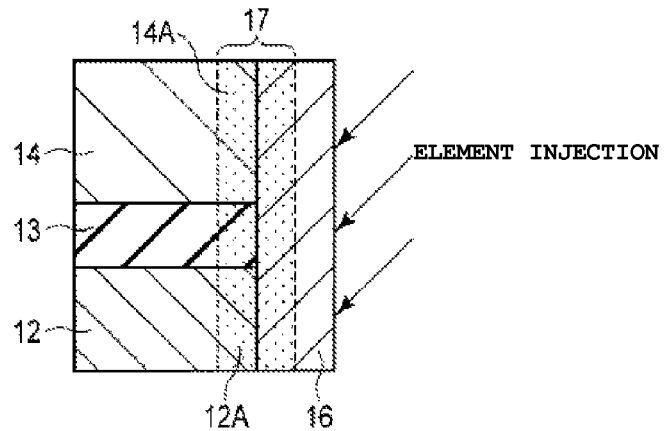
FIG. 17 is a cross-sectional view illustrating a manufacturing operation of an MTJ element according to a fifth embodiment.

Then, as shown in FIG. 17, an element for deactivating the magnetization of the magnetic layers (Ge (germanium) or Si (silicon) or the like) is injected into the end portion of the entire circumference of the MTJ element. By the element injection operation, the element for deactivating the magnetization is injected into the end portion 12A of the entire circumference of the memory layer 12, the end portion 14A of the entire circumference of the reference layer 14, and a portion of the re-attached substance 16. In FIG. 17, the hatched portion indicates the element injecting region 17 as the region where the element for deactivating the magnetization is injected. The magnetization is deactivated for the end portion 12A of the memory layer 12 where the element is injected. Similarly, the magnetization is deactivated for the end portion 14A of the reference layer 14 where the element is injected.

Figure 18:
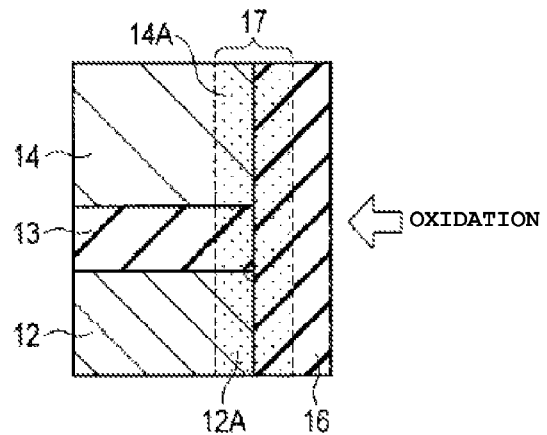
FIG. 18 is a cross-sectional view illustrating the manufacturing operation of the MTJ element after the process shown in FIG. 17.

Then, as shown in FIG. 18, the re-attached substance 16 is oxidized. As a result, the re-attached substance 16 becomes the insulating oxide (re-attached oxide), so that it is possible to prevent short circuit between the memory layer 12 and the reference layer 14.

By the process of oxidation of the re-attached substance 16, magnetic damages take place on the side wall of the MTJ element. However, the magnetization is deactivated at the end portion of the memory layer 12 and the end portion of the reference layer 14. As a result, it is possible to alleviate the damping damages of the end portion of the memory layer 12 and the end portion of the reference layer 14, and it is thus possible to alleviate the degradation in the magnetic characteristics of the memory layer 12 and the reference layer 14.

In addition, as the injected element is oxidized in the operation of oxidation of the re-attached substance 16, it is possible to alleviate oxidation of the magnetic layers (the memory layer 12 and the reference layer 14) relatively. As a result, it is possible to alleviate the damping damages of the magnetic layers by oxidation.

Sixth Embodiment

According to a sixth embodiment, after the operation of oxidation of the re-attached substance formed on the side wall of the MTJ element, the magnetization is deactivated for the end portion of the memory layer 12 and the end portion of the reference layer 14.

In the following, the manufacturing method of the MTJ element according to the sixth embodiment will be explained with reference to the drawings. The processes of manufacturing until that shown in FIGS. 3A and 3B are the same as those in the first embodiment.

Figure 19:
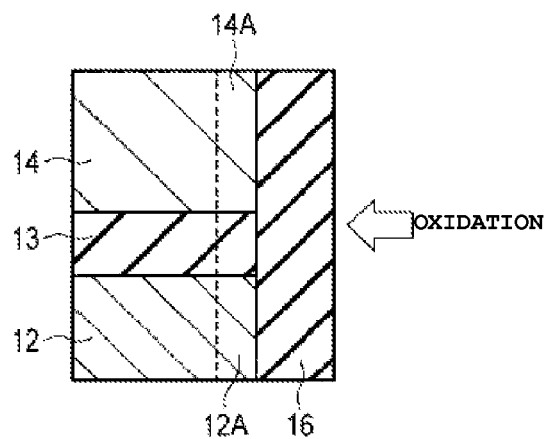
FIG. 19 is a cross-sectional view illustrating a manufacturing operation of an MTJ element according to a sixth embodiment.

Then, as shown in FIG. 19, the re-attached substance 16 is oxidized. As a result, the re-attached substance 16 becomes the insulating oxide (re-attached oxide), so that it is possible to prevent short circuit between the memory layer 12 and the reference layer 14. By the operation of oxidation of the re-attached substance 16, magnetic damages take place on the side wall of the MTJ element, and the magnetic characteristics of the memory layer 12 and the reference layer 14 degrade. As a result, the damping damages of the memory layer 12 and the reference layer 14 becomes significant, and the spin injection efficiency of the MTJ element degrades.

Figure 20:
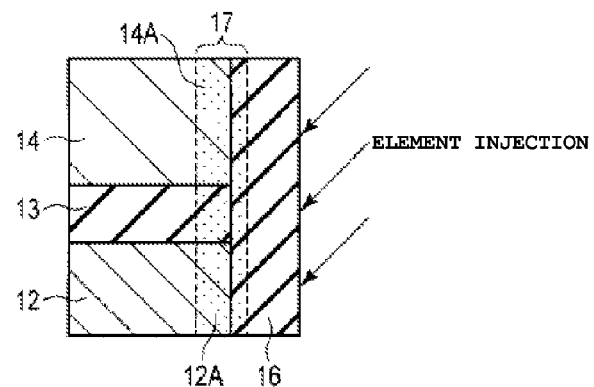
FIG. 20 is a cross-sectional view illustrating the manufacturing operation of the MTJ element after the process shown in FIG. 19.

Then, as shown in FIG. 20, an element for deactivating the magnetization of the magnetic layers (Ge (germanium) or Si (silicon) or the like) is injected into the end portion of the entire circumference of the MTJ element. By this element injection process, the element for deactivating the magnetization of the magnetic layer is injected into the end portion 12A of the entire circumference of the memory layer 12, the end portion 14A of the entire circumference of the reference layer 14, and a portion of the re-attached substance 16. In FIG. 20, the hatched portion indicates the element injecting region 17 as the region where the element for deactivating the magnetization is injected.

In this way, according to the sixth embodiment, it is possible to deactivate the magnetization of the portion where magnetic damages take place even when magnetic damages take place in the end portion of the memory layer 12 and the end portion of the reference layer 14 due to the operation of oxidation of the re-attached substance 16. As a result, it is possible to alleviate the damping damages for the end portion of the memory layer 12 and the end portion of the reference layer 14, so that it is possible to alleviate degradation in the magnetic characteristics of the memory layer 12 and the reference layer 14.

Seventh Embodiment

According to a seventh embodiment, by injecting a prescribed element into the re-attached substance formed on the side wall of the MTJ element, the resistance of the re-attached substance is increased, and it is possible to prevent short circuit between the memory layer 12 and the reference layer 14.

Figure 21A:
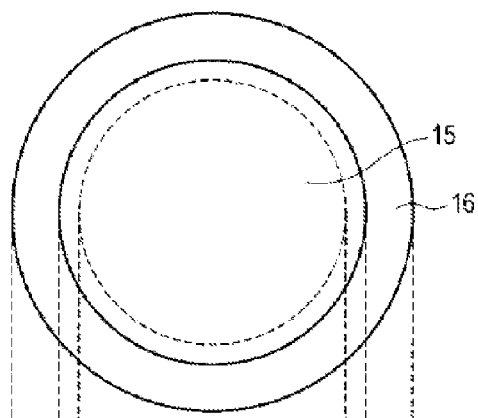
FIGS. 21A and 21B include a plane view and a cross-sectional view illustrating an MTJ element according to a seventh embodiment.
Figure 21B:
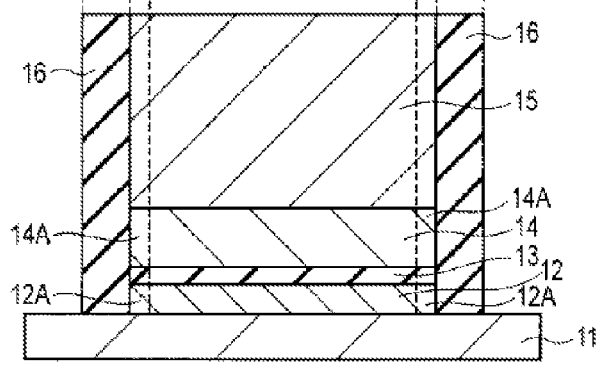

FIG. 21A is a plane view of the MTJ element according to the seventh embodiment. FIG. 21B is a cross-sectional view illustrating the MTJ element in this embodiment. The MTJ element has the following layers laminated sequentially from the bottom: the base electrode (lower electrode) 11, the memory layer 12, the insulating layer (tunnel barrier layer) 13, a reference layer 14, and the hard mask layer 15.

On the side wall of the MTJ element, the re-attached substance 16 formed during processing of the side wall of the MTJ element is arranged. The re-attached substance 16 contains the materials of the base electrode 11 and the memory layer 12. Also, the element for deactivating the magnetization of the magnetic layers and for increasing the electrical resistance of the re-attached substance 16 is injected in the re-attached substance 16.

In addition, the same element as that injected into the re-attached substance 16 is injected into the end portion 12A of the entire circumference of the memory layer 12. Similarly, the same element as the element injected into the re-attached substance 16 is injected into the end portion 14A of the entire circumference of the reference layer 14. That is, the magnetization is deactivated for the end portion 12A of the memory layer 12 and the end portion 14A of the reference layer 14.

The element for deactivating the magnetization and for increasing the electrical resistance of the re-attached substance 16 refers to at least one element selected from the group consisting of He (helium), C (carbon), F (fluorine), Ne (neon), Si (silicon), P (phosphorus), S (sulfur), Cl (chlorine), Ar (argon), Ge (germanium), As (arsenic), Kr (krypton), and Sb (antimony).

For the MTJ element with the structure, it is possible to increase the electrical resistance of the re-attached substance 16, so that it is possible to prevent short circuit between the memory layer 12 and the reference layer 14.

In the following, the manufacturing method of the MTJ element according to the seventh embodiment will be explained with reference to the drawings. The processes of manufacturing until that shown in FIGS. 3A and 3B are the same as those in the first embodiment.

Figure 22:
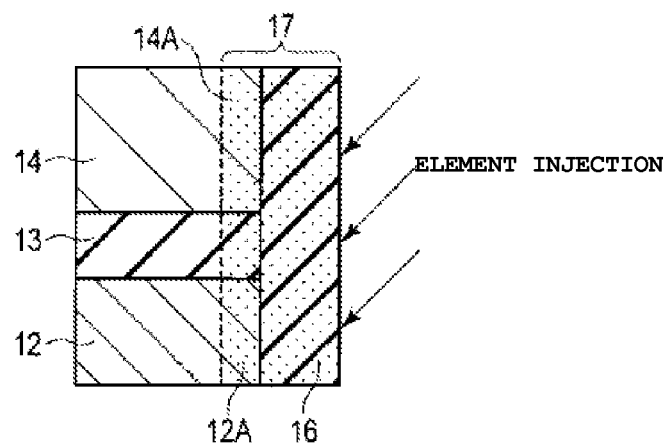
FIG. 22 is a cross-sectional view illustrating the manufacturing operation of an MTJ element according to the seventh embodiment.

Then, as shown in FIG. 22, the element for deactivating the magnetization of the magnetic layers and for increasing the electrical resistance of the re-attached substance (Ge (germanium) or Si (silicon) or the like) is injected into the re-attached substance 16. In the element injection operation, it is necessary to inject the element to the entirety of the re-attached substance 16. Consequently, the element is also injected into the end portion 12A of the memory layer 12 and the end portion 14A of the reference layer 14, so that the magnetization is deactivated for the end portion 12A of the memory layer 12 and the end portion 14A of the reference layer 14.

As a result, the electrical resistance of the re-attached substance 16 is increased; it is possible to prevent the short circuit between the memory layer 12 and the reference layer 14. As the magnetization is deactivated for the end portion 12A of the memory layer 12 and the end portion 14A of the reference layer 14, there is no degradation in the magnetic characteristics of the memory layer 12 and the reference layer 14.

According to the present embodiment, there is no need to carry out the operation for removing the re-attached substance 16 and the operation for oxidation. As a result, it is possible to prevent degradation in the magnetic characteristics of the memory layer 12 and the reference layer 14.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising:
a laminated structure including a first magnetic layer, an insulating layer, and a second magnetic layer formed on a base electrode, wherein each of the first and second magnetic layers includes an outer periphery portion, at least one element selected from the group consisting of He, C, N, O, F, Ne, Ti, V, Cu, Al, Si, P, S, Cl, Ar, Ge, As, Kr, Zr, In, Sn, Sb, Pb and Bi is included in each of the outer periphery portions, and a magnetization of the outer periphery portions of the first and second magnetic layers is deactivated; and a side wall formed on the laminated structure, the side wall containing materials of the first magnetic layer and the base electrode.

2. The magnetoresistive element according to claim 1, wherein the first magnetic layer, the insulating layer, and the second magnetic layer are sequentially laminated on top of the base electrode.

3. The magnetoresistive element according to claim 2, wherein a magnetization inversion current of the first magnetic layer is lower than a magnetization inversion current of the second magnetic layer.

4. A magnetoresistive element comprising:
a laminated structure including a first magnetic layer, an insulating layer, and a second magnetic layer formed on a base electrode, wherein at least one element selected from the group consisting of He, C, N, O, F, Ne, Ti, V, Cu, Al, Si, P, S, Cl, Ar, Ge, As, Kr, Zr, In, Sn, Sb, Pb and Bi is injected into outer periphery portions of the first and second magnetic layers, said at least one element deactivating a magnetization of the outer periphery portions of the first and second magnetic layers; and a side wall formed on the laminated structure, the side wall containing materials of the first magnetic layer and the base electrode.

5. The magnetoresistive element according to claim 4, wherein the side wall includes said at least one element injected therein.

6. The magnetoresistive element according to claim 5, wherein the side wall attains an increased resistance as a result of said at least one element being injected in the side wall.

7. A magnetoresistive element comprising:
a laminated structure including a first magnetic layer, an insulating layer, and a second magnetic layer formed on a base electrode, wherein each of the first and second magnetic layers includes an outer periphery portion, at least one element selected from the group consisting of He, C, N, O, F, Ne, Ti, V, Cu, Al, Si, P, S, Cl, Ar, Ge, As, Kr, Zr, In, Sn, Sb, Pb and Bi is included in each of the outer periphery portions, and a magnetization of the outer periphery portions of the first and second magnetic layers is deactivated; and a side wall formed on the laminated structure, the side wall containing materials of the first magnetic layer and the base electrode, and said at least one element.

8. The magnetoresistive element according to claim 7, wherein the side wall attains an increased resistance as a result of said at least one element being included in the side wall.

* * * * *